(12) United States Patent
Lemsitzer et al.

(10) Patent No.: US 8,701,077 B1
(45) Date of Patent: Apr. 15, 2014

(54) INDIVIDUAL ROM CODES ON A SINGLE RETICLE FOR A PLURALITY OF DEVICES

(71) Applicant: NXP B.V., Eindhoven (NL)

(72) Inventors: Stefan Lemsitzer, Stainz (AT); Heimo Scheucher, Langegg (AT); Claus Grzyb, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/710,291

(22) Filed: Dec. 10, 2012

(51) Int. Cl.
*G06F 17/50* (2006.01)

(52) U.S. Cl.
USPC ............. 716/139; 716/55; 716/111; 716/116

(58) Field of Classification Search
CPC ......... G06F 17/10; G06F 17/04; G06F 17/50; G06F 9/455
USPC .................................. 714/55, 111, 116, 139
See application file for complete search history.

(56) References Cited

U.S. PATENT DOCUMENTS

| | | | |
|---|---|---|---|
| 6,875,659 B2 * | 4/2005 | Yang et al. | 438/275 |
| 7,305,638 B1 | 12/2007 | Stine | |
| 7,556,893 B2 | 7/2009 | Leroux | |
| 8,264,092 B2 | 9/2012 | Scheucher | |
| 2003/0235789 A1 * | 12/2003 | Chang | 430/312 |
| 2008/0059128 A1 * | 3/2008 | Tejnil | 703/2 |
| 2010/0270655 A1 | 10/2010 | Scheucher et al. | |
| 2011/0180931 A1 | 7/2011 | Roozeboom et al. | |

* cited by examiner

*Primary Examiner* — Thuan Do

(57) ABSTRACT

Aspects of the present disclosure are directed toward methods and systems which generate a plurality of Read-Only Memory (ROM) codes. In response to generating the ROM codes, an image is generated for each of the plurality of ROM codes. The images for each of the plurality of ROM codes are mapped on a single reticle, and a wafer is provided, which includes a plurality of individual devices. The reticle is utilized, which includes an image for each of the plurality of ROM codes, to print a respective one of the images onto a respective one of the plurality of individual devices.

16 Claims, 4 Drawing Sheets

| 0 | 1 | 1 | 1 | 0 | 0 | 1 | 1 | 1 | 0 | 0 | 0 | 1 | 1 | 1 |
|---|---|---|---|---|---|---|---|---|---|---|---|---|---|---|
| 1 | 0 | 1 | 1 | 0 | 0 | 1 | 0 | 1 | 0 | 1 | 1 | 1 | 1 | 1 |
| 1 | 0 | 0 | 1 | 0 | 0 | 0 | 1 | 1 | 1 | 0 | 0 | 1 | 1 | 0 |
| 1 | 1 | 0 | 0 | 1 | 1 | 1 | 1 | 0 | 0 | 1 | 0 | 1 | 0 | 1 |
| 0 | 1 | 1 | 1 | 1 | 1 | 0 | 0 | 0 | 0 | 1 | 0 | 1 | 0 | 0 |
| 0 | 0 | 1 | 1 | 0 | 0 | 1 | 1 | 0 | 0 | 0 | 0 | 1 | 1 | 1 |
| 1 | 0 | 0 | 1 | 1 | 1 | 1 | 0 | 0 | 0 | 0 | 1 | 1 | 1 | 0 |
| 1 | 1 | 0 | 1 | 1 | 1 | 0 | 0 | 1 | 1 | 0 | 0 | 1 | 1 | 0 |
| 0 | 1 | 1 | 0 | 0 | 1 | 1 | 0 | 0 | 1 | 1 | 0 | 0 | 1 | 1 |
| 0 | 0 | 1 | 1 | 1 | 1 | 1 | 0 | 0 | 0 | 0 | 1 | 1 | 0 | 0 |

FIG. 4

INDIVIDUAL ROM CODES ON A SINGLE RETICLE FOR A PLURALITY OF DEVICES

Manufacturing of semiconductor devices includes multiple steps of processing such as, for example, deposition or growing of material onto a silicon wafer, removing portions of the deposited material through a wet or dry etching process, patterning the deposited materials to alter the shape of the semiconductor device, and doping to provide the semiconductor device with desired electrical properties. Semiconductor devices are manufactured in large batches, up to one thousand at a time, with photolithography applied to all the semiconductor devices in a batch at the same time. Patterning of semiconductor devices can be accomplished using photolithography. Photolithography is broadly described to be projecting of light through a geometric pattern to a light-sensitive aspect of the semiconductor device. Certain portions of the geometric pattern will allow light through to the light-sensitive aspect of the semiconductor device, and others will not. Accordingly, portions of the light-sensitive aspect will remain, and others will be patterned and removed. Certain methods of photolithography utilize a mask (or reticle in a step-and-repeat projection system) with a geometric patterned contained on the reticle. A reticle can carry the pattern for each of the plurality of semiconductor devices such that multiple devices are all patterned at the same time. The pattern is replicated in a layer of photosensitive material (e.g., photoresist) on the semiconductor device that has been applied on top of a substrate by first exposing the photoresist layer through the mask and thereby forming a pattern related latent image within the layer of photoresist. The latent image becomes fixed to become a (permanently registered) image within the exposed layer of photoresist. The devices are subsequently separated and sold individually.

Read-Only Memory (ROM) can be programmed (or coded) using such a reticle and mask system. Data to be programmed on the ROM, e.g., a ROM code, is permanently stored therein by physically reproducing the ROM code onto a device. Generally, physically coded (masked ROM) is less expensive then rewritable memory because it is compact. However, because the coded data is stored physically and permanently on the semiconductor device, the device can be decoded by physical inspection, and/or otherwise susceptible to breach.

Various example embodiments are directed to methods and systems of individually physically coding data onto a plurality of semiconductor devices. This physical coding allows for programming of a plurality of Read-Only Memory semiconductor devices, with each of the semiconductor devices having its own unique, and in certain instances, its own randomized code. As semiconductor devices are produced in large batches (hundreds at a time), the individualized physical mapping of codes onto the devices will provide for enhanced security of the devices.

For instance, certain aspects of the present disclosure are directed towards methods that include generating a plurality of Read-Only Memory (ROM) codes. In response to generating of the ROM codes, an image is generated for each of the plurality of ROM codes. The images for each of the plurality of ROM codes are mapped on a single reticle. A wafer is provided that includes a plurality of individual devices, and the reticle is utilized, which includes an image for each of the plurality of ROM codes, to print a respective one of the images onto a respective one of the plurality of individual devices.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which:

FIG. 4 shows an example 2-dimensional array which represents the physical locations of ROM coding, consistent with various aspects of the present disclosure.

Figure 1:
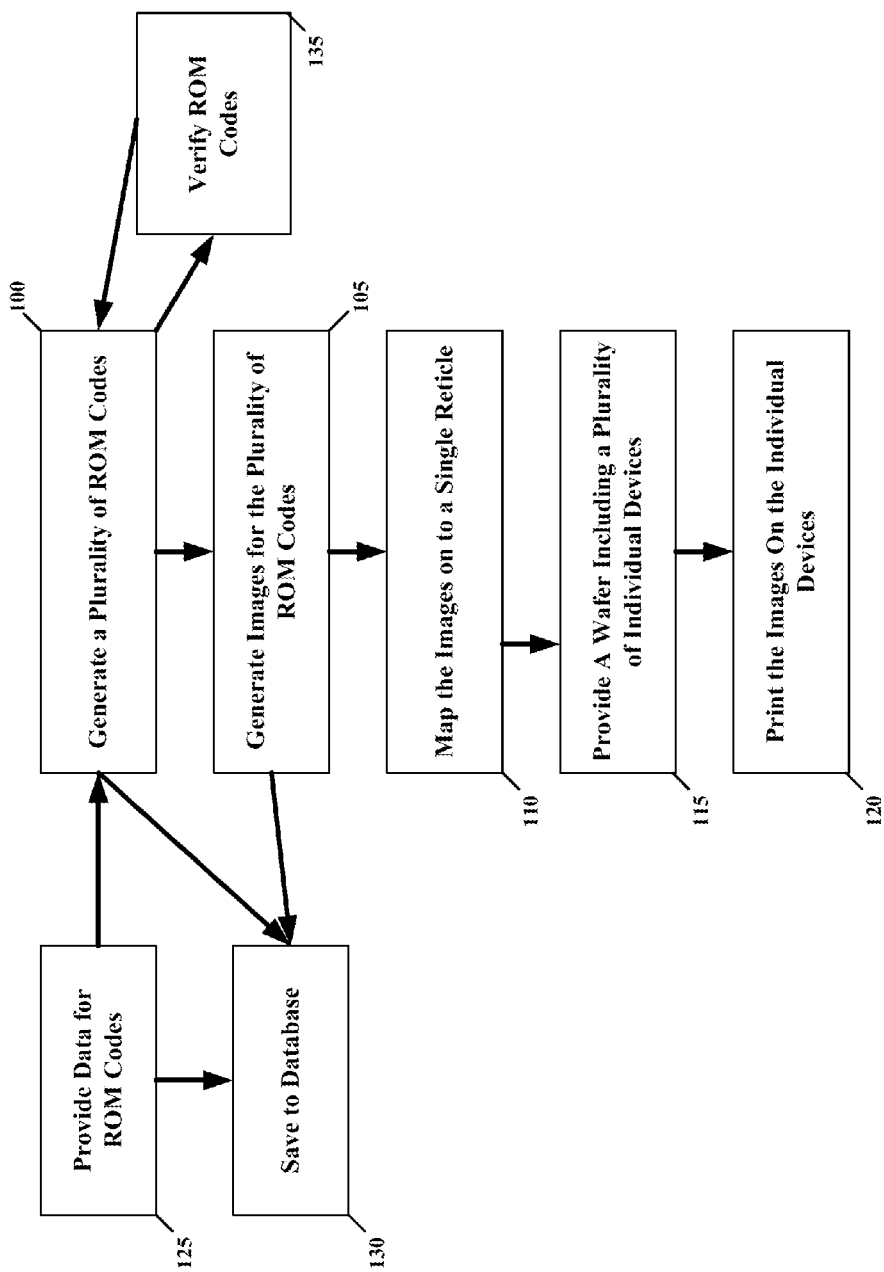
FIG. 1 shows an example block diagram of a method of manufacturing, consistent with various embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving a plurality of manufactured semiconductor devices each having a plurality of individualized ROM codes, and that are produced in the same manufacturing batch. While not necessarily so limited, various aspects may be appreciated through a discussion of examples using this context.

Various example embodiments are directed to methods of manufacturing a plurality of semiconductor devices. Aspects of the present disclosure utilize a reticle to apply individualized patterns (e.g., ROM codes) to a plurality of semiconductor devices. Accordingly, each of the manufactured devices is provided with a unique and individualized pattern or code. This individualized method of providing a ROM code physically to an individual device, while maintaining high-throughput manufacturing, allows for lessened susceptibility of physical attacks of the manufactured semiconductor device. Because each device will be provided with an individualized, and in certain embodiments randomized, code, determining the physical layout of one device in the batch will not result in knowing all the physical layouts in batch.

Aspects of the present disclosure include utilizing a file format for representing geometric images. The file format can be, in certain embodiments, in a binary format, but can also be in another suitable format (such as hexadecimal) that would be able to be representative of a geometric image. Graphic Database System II file (GDSII) provides an example of one type of format that can be used to provide a physical layout for a semiconductor device. GDSII is a binary data exchange format used for data exchange of integrated circuit. The binary format can include a data representation of geometric shapes. Further, GDSII data can also include textual labeling to be provided to a semiconductor device. While GDSII is used to exemplify this type of format, one skilled in the art would understand that other types of file formats can be used with the present disclosure.

Accordingly, certain embodiments of the present disclosure are directed toward methods that include generating a plurality of ROM codes. In certain specific embodiments, the plurality of ROM codes can be generated in response to data provided by an external customer. The data can be in the form of hexadecimal or any other type of acceptable coding format (e.g., binary). Methods of the present disclosure further proceed by generating images (e.g., Graphic Database System II (GDS II) images) for each of the plurality of ROM codes. In certain specific embodiments, generating the images includes generating a 2-dimensional array of coordinates that represents physical locations of bits of the plurality of ROM codes. Additionally, various embodiments of the present disclosure are further characterized in that generating the plurality of ROM codes includes generating a random key for each of the plurality of ROM codes. The methods, consistent with various aspects of the present disclosure, also include mapping the images, for each of the plurality of ROM codes, on a single reticle. A wafer is provided that includes a plurality of individual devices, and using the single reticle, methods of the present disclosure provide the individual devices with a unique and individual ROM code by printing a respective one of the images onto a respective one of the plurality of individual devices.

In certain more specific embodiments of the present disclosure, an additional step is included in methods of verifying the plurality of ROM codes by checking for basis errors in a hexadecimal format of the plurality of ROM codes. Additionally, embodiments of the present disclosure include methods that also include saving the images for each of the plurality of ROM codes to a database. Further, certain embodiments of the present disclosure include saving the plurality of ROM codes to a database.

Turning now to the Figures, FIG. 1 shows an example block diagram of a method of manufacturing, consistent with various embodiments of the present disclosure. As shown in FIG. 1 a plurality of ROM codes are generated at block 100. The plurality of ROM codes can be generated randomly, for instance in a hexadecimal format, or data can be provided from a customer or another type of source in order to provide a known input for the plurality of ROM codes. Providing of data is illustrated in block 125. In certain embodiments, the data provided for generation of ROM codes is saved in a database, as illustrated by block 130. In this manner, the data can be replaced or manipulated, for example, to produce a further set of ROM codes. As illustrated in block 105, images are generated for the plurality of ROM codes. An individual and unique (when compared to the other images) image is generated for each of the plurality of ROM codes. Accordingly, the number of ROM codes generated will be based on the number of individual semiconductor devices to be generated in a single batch. As discussed further below, a wafer can include anywhere from two to ten-thousand semiconductor devices that will be printed with ROM codes in a single batch. In certain specific embodiments, the wafer includes between two-hundred and six-hundred semiconductor devices (e.g., in a 20×30 array) that will be printed with ROM codes in a single batch.

Subsequently, as illustrated by block 110, each of the images generated will be mapped onto a single reticle. This reticle will be used to provide individualized patterns corresponding to the images. For instance, the pattern corresponds to transparent and opaque areas on the surface of the reticle (composed of a material such as quartz). As indicated at step 115, a wafer, including a plurality of individual devices, will be provided. The devices can be separated or can be included on a single sheet that will be separated subsequent to the ROM code mapping process.

The semiconductor devices are arranged in grid or matrix-form on the wafer and are separated by saw lines (also referred to as scribe lines). The saw or scribe lines are used to separate the semiconductor devices from each other by, for example, using the saw lines that run in parallel in a first direction, and second, by using the saw lines that run parallel in a second direction (perpendicular to the first direction). The wafer can also include alignment bumps for aligning the reticle.

As illustrated in block 120, the ROM code images will be then printed onto the individual devices. Mapping of the ROM codes are accomplished by projecting light through the reticle. In this manner, photosensitive material in each of the individual devices will be affected such that certain portions of the photosensitive material will remain, and others will be washed away. The portions of the photosensitive material that will remain are blocked from the light by the opaque patterns on the reticle. The opaque patterns do not allow light through, therefore, the portions of the photosensitive material will not be exposed to light, and will not be structurally compromised.

In certain embodiments a stepper arrangement is used to apply the patterns on the reticle to the plurality of semiconductor devices. The stepper can include a light source, a reticle, a lens, and a stage used to position semiconductor devices on the wafer for application of the image. The light source projects light through the transparent portions of the patterns on the reticle, and through the lens onto a wafer located on the stage. By doing so, the patterns on the reticle are reproduced onto the individual semiconductor devices on the wafer. For further discussion of the process through which a pattern is applied using a reticle, see issued U.S. Pat. No. 7,556,893, which is herein incorporated by reference.

After the semiconductor wafer is exposed to the reticle, the wafer is developed in order to permanently print the ROM code on the semiconductor devices. For instance, portions of the wafer that were exposed to light are structurally compromised. The image pattern corresponding to the ROM code protects the areas of the structure that are intended to be maintained as structure. Therefore, the portions of the wafer that were exposed are washed away by acids or other chemicals. In this manner, the portions of the wafer will reproduce the pattern on the reticle.

In addition to the data for ROM codes being saved to a database, the ROM codes themselves, generated at block 100, and the images, corresponding to the generated ROM codes, can also be saved in the data base. This will allow for manipulation or replication of the data used to generate a ROM code, the ROM code, and/or the image. Further, as illustrated by block 135, the ROM codes can be verified by checking for basis errors in a hexadecimal format of the plurality of ROM codes.

Figure 2:
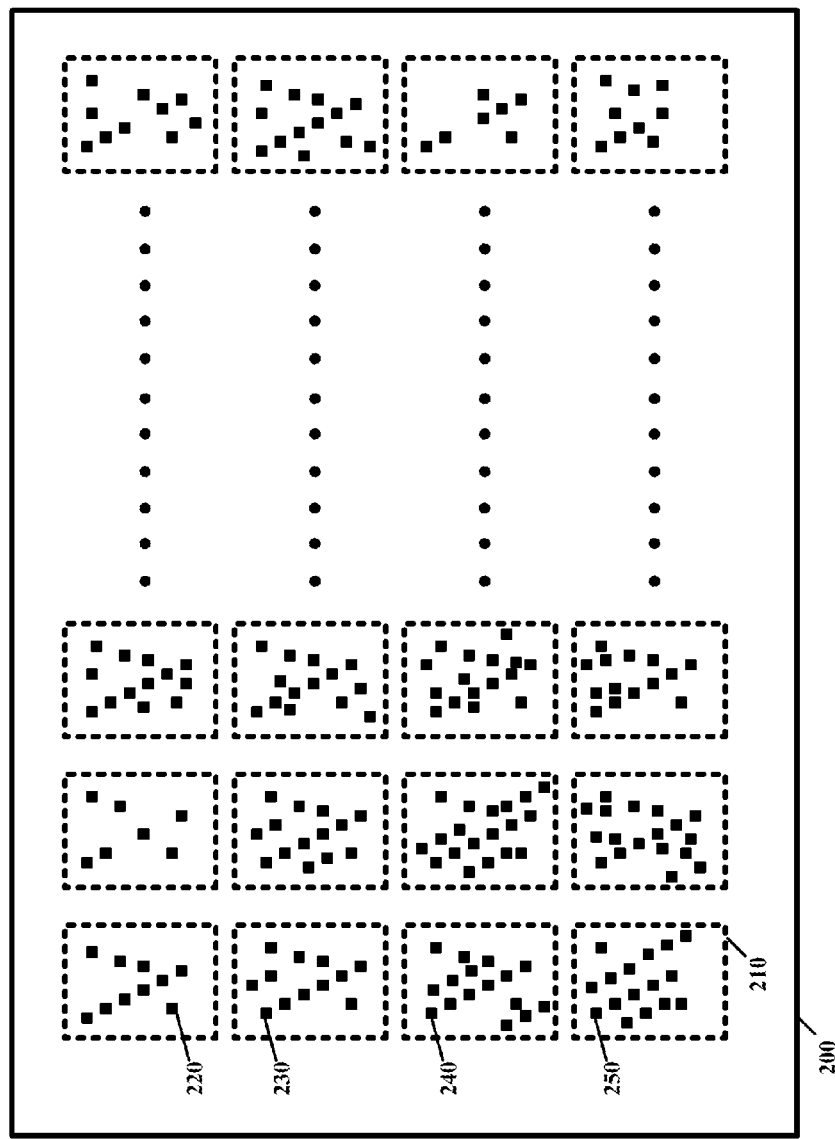
FIG. 2 shows an example embodiment of a reticle including mapping of a plurality of images, consistent with various aspects of the present disclosure.

FIG. 2 shows an example embodiment of a reticle 200 including mapping of a plurality of images, consistent with various aspects of the present disclosure. The reticle 200 includes a number of individualized patterns of images 210 that have been mapped thereon. Each of the patterns of images 210 include a different physical coding 220/230/240/250 that will correspond to a different physical pattern on a semiconductor device. The different physical coding 220/230/240/250 is illustrated by the different patterns in each of the individualized patterns of images 210. In certain embodiments of the present disclosure, the reticle 200 can be aligned with a wafer including a plurality of individual devices using a cross-hair type arrangement provided, for example, at the corners of the reticle 200. In this manner, the reticle 200 is aligned with the corners of the square wafer (including the individual semiconductor devices).

Figure 3:
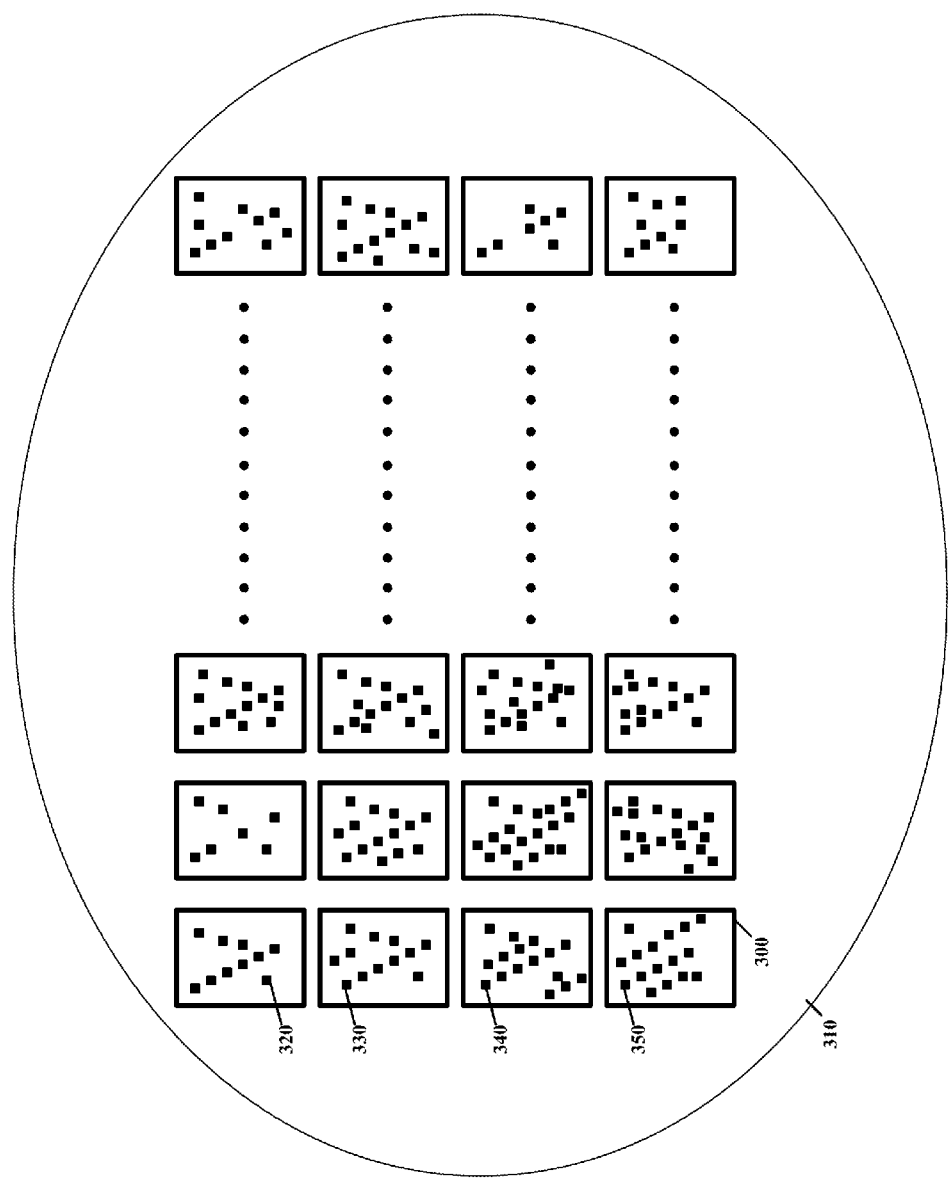
FIG. 3 illustrates an example arrangement of semiconductor devices on a wafer having images mapped thereon, consistent with various embodiments of the present disclosure.

FIG. 3 illustrates an example arrangement of semiconductor devices on a wafer having images mapped thereon, consistent with various embodiments of the present disclosure. The semiconductor devices 300 are shown disposed on a wafer 310. The solid outline of the semiconductor devices 300 is not necessarily provided to indicate that the devices are separated, but to show an outline of what is or will become a plurality of semiconductor devices 300. On each of these semiconductor devices 300 is the mapped image 320/330/340/350. The mapped image 320/330/340/350 shown in FIG. 3 is shown as corresponding to the image provided on the reticle as shown in FIG. 2.

Separation of the semiconductor devices may, for example, be performed utilizing an appropriate saw or laser. When utilizing the saw, the semiconductor devices may be separated by sawing along the saw lines. When utilizing the laser, the laser may be guided along the saw lines producing scribes in the saw lines or altering the material at the saw lines. In these instances, the semiconductor devices are not yet separated, and are attached to a frame carrier. Then, the frame carrier, carrying the semiconductor devices, are broken apart by, for instance, breaking the saw lines by appropriately flexing the wafer. The separation may also be preformed utilizing deep trench etching technology with very small deep trenches. For further discussion of separation of semiconductors and further processing of the devices, see issued U.S. Pat. No. 8,264,092, which is herein incorporated by reference.

FIG. 4 shows an example 2-dimensional array which represents the physical locations of ROM coding, consistent with various aspects of the present disclosure. Data that is to be generated into a ROM code is provided in this two-dimensional array. A "1" stands for "coded", a "0" for "uncoded". The data values, for example, indicate whether or not a specific portion is given structure.

In certain embodiments, in generating a ROM code for every device within a reticle, a random key is chosen that then is used to scramble and encrypt the code.

Based upon the above discussion and illustrations, those skilled in the art will readily recognize that various modifications and changes may be made to the various embodiments without strictly following the exemplary embodiments and applications illustrated and described herein. Such modifications do not depart from the true spirit and scope of various aspects of the invention, including aspects set forth in the claims.

What is claimed is:

1. A method comprising:
   generating a plurality of ROM codes;
   generating images for each of the plurality of ROM codes;
   mapping the images for each of the plurality of ROM codes on a single reticle; and
   manufacturing a plurality of individual circuit devices by providing a wafer with the plurality of individual devices, the step of manufacturing including
      using the single reticle, printing a respective one of the images onto a respective one of the plurality of individual circuit devices, wherein each of the plurality of individual circuit devices has a unique and individual one of the plurality of ROM codes.

2. The method of claim 1, further including a step of verifying the plurality of ROM codes by checking for basis errors in a hexadecimal format of the plurality of ROM codes.

3. The method of claim 1, wherein the step of using an integrated circuit for generating the images includes generating a 2-dimensional array of coordinates that represents physical locations of bits of the plurality of ROM codes.

4. The method of claim 1, wherein the step of generating the plurality of ROM codes includes generating a random key for providing an encryption for the plurality of ROM codes.

5. The method of claim 1, further including a step of saving the images for each of the plurality of ROM codes to a database.

6. The method of claim 1, further including a step of saving the plurality of ROM codes to a database.

7. The method of claim 1, wherein the step of providing the wafer including the plurality of individual circuit devices, includes providing a range between three-hundred and six-hundred semiconductor devices.

8. The method of claim 1, wherein the step of generating images includes generating Graphic Database System II (GDS II) images.

9. The method of claim 1, wherein the plurality of ROM codes are generated by using an encoding or scrambling the ROM codes so that each of the plurality of ROM codes is unique relative to the other ROM codes.

10. The method of claim 9, wherein the plurality of ROM codes are generated for preventing decoding of information about other ones of the plurality of individual circuit devices manufactured from the same wafer.

11. The method of claim 1, wherein the plurality of ROM codes are generated for preventing decoding of information about other ones of the plurality of individual circuit devices manufactured from the same wafer.

12. The method of claim 1, wherein the plurality of RUM codes are generated by using a randomization scheme that is useful for preventing decoding of information about other ones of the plurality of individual circuit devices manufactured from the same wafer.

13. The method of claim 1, wherein each of the plurality of ROM codes is useful for characterizing information about at least one of the plurality of individual circuit devices.

14. The method of claim 1, wherein the plurality of ROM codes are respectively representative of data associated with the plurality of individual circuit devices.

15. The method of claim 1, wherein each of the generated images for the plurality of ROM codes is unique from all the other ROM codes.

16. A method comprising:
   providing data for a plurality of ROM codes by an external customer;
   generating a plurality of ROM codes using the data;
   generating images for each of the plurality of ROM codes;
   mapping the images for each of the plurality of ROM codes on a single reticle; and
   manufacturing a plurality of individual circuit devices by providing a wafer with the plurality of individual devices, said manufacturing including using the single reticle, printing a respective one of the images onto a respective one of the plurality of individual devices.

\* \* \* \* \*